United States Patent [19]

Sawada et al.

[11] Patent Number: 5,102,483
[45] Date of Patent: Apr. 7, 1992

[54] METHOD FOR PRODUCTION OF ELONGATED CERAMIC SHEETS

[75] Inventors: Syoryu Sawada; Makoto Higuchi; Takayuki Hizawa, all of Yokohama, Japan

[73] Assignee: JGC Corporation, Tokyo, Japan

[21] Appl. No.: 482,818

[22] Filed: Feb. 21, 1990

[30] Foreign Application Priority Data

Feb. 27, 1989 [JP] Japan .................. 1-46032
Jul. 11, 1989 [JP] Japan .................. 1-178578
Nov. 13, 1989 [JP] Japan .................. 1-294256

[51] Int. Cl.[5] ............................. B32B 18/00
[52] U.S. Cl. .................... 156/89; 156/289; 427/62; 427/63; 505/809; 505/815
[58] Field of Search ............ 156/89, 289; 427/62, 427/63; 505/809, 815, 816, 822, 917, 926

[56] References Cited

U.S. PATENT DOCUMENTS

| | | | |
|---|---|---|---|
| 3,615,881 | 10/1971 | Greene | 505/815 |
| 3,695,960 | 10/1972 | Richter | 156/89 |
| 3,767,500 | 10/1973 | Tally et al. | 156/289 |
| 4,475,967 | 10/1984 | Kanai et al. | 156/89 |
| 4,985,103 | 1/1991 | Kouno et al. | 156/89 |

FOREIGN PATENT DOCUMENTS 63-178549 7/1988 Japan.

*Primary Examiner*—Caleb Weston
*Attorney, Agent, or Firm*—Hoffmann & Baron

[57] ABSTRACT

A method for production of a ceramic sheet includes the following steps: First, a pair of green sheets are prepared from ceramic material by the doctor-blade method. Each of the green sheets has first and second surfaces. The prepared sheets are placed one on the other and adhered to each other in such a manner that the first surfaces of the green sheets oppose each other. Alternatively, the second surfaces of the sheets may oppose each other. As a result, a united green sheet is obtained. A separating sheet is disposed on a side of the united green sheet. The united green sheet is rolled, with the separating sheet, around a core. The united green sheet, with the separating sheet, is sintered in a rolled configuration thereby producing a rolled ceramic sheet.

6 Claims, 4 Drawing Sheets

METHOD FOR PRODUCTION OF ELONGATED CERAMIC SHEETS

BACKGROUND OF THE INVENTION

The present invention relates to a method for production of elongated ceramic sheets. An object of the invention is to improve the doctor-blade method and thereby to provide an elongated ceramic sheet with few undulations or warps. The present invention also relates to a method for production of elongated superconducting sheets.

Conventionally, ceramic sheets, utilized as substrates in the electronics field, are manufactured by the doctor-blade method. In the method, a ceramic powder, such as $Al_2O_3$ or $ZrO_2$, is first mixed with a medium (example: water). The mixture is then mixed with other necessary compounds, such as binders or plasticizers. As a result, a uniform slurry is obtained. The slurry is then painted at a prescribed thickness on a carrier tape using a doctor-blade. Next, the medium is evaporated by hot air or infrared rays, so that the slurry is hardened to a green sheet (unsintered ceramic sheet). Then, the green sheet obtained is cut to prescribed dimensions, and the cut green sheets are sintered in a sintering furnace so as to form the ceramic sheets.

In the conventional doctor-blade method, several problems exist as described hereinafter.

The length of the ceramic sheet to be obtained is limited by the size of the sintering furnace. In other words, it is impossible to make a sheet longer than the length of the sintering furnace.

Figure 12:
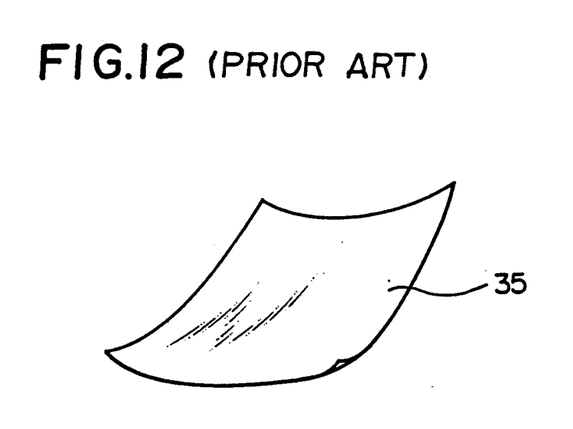
FIG. 12 shows a warped ceramic sheet of the prior art.

The green sheet varies in composition through its thickness due to gravitational-setting effects during hardening. Because of this nonuniformity of composition, the ceramic sheet comes to have undulations or warps caused by differential expansion of the faces of the green sheet during sintering, as shown in FIG. 12. In FIG. 12, numeral 35 denotes a sintered ceramic with warped edges.

Recently, various oxide superconductors having critical temperatures higher than the temperature of liquid nitrogen have been discovered (for example, the Y-Ba-Cu-O group, the Bi-Sr-Ca-Cu-O group, and the Tl-Ba-Ca-Cu-O group).

Conventionally, the oxide superconductors are produced by one of the following methods:

(1) A method wherein the material powder is mixed, shaped into a final form, and then sintered.

(2) A method wherein the mixed material powder obtained by coprecipitation is shaped into a final form and then sintered.

(3) A method wherein a thin superconducting film is formed on a platelike substrate by sputtering, chemical vapor deposition, or other deposition process.

Oxide superconductors produced by the above methods have poor mechanical strength and elasticity. Therefore, if such superconductors are formed into elongated shapes, like sheets or ribbons, the superconducting sheets are too fragile for practical use.

SUMMARY OF THE INVENTION

Accordingly, it is an object of the present invention to improve the doctor-blade method, and to provide a method for the production of an elongated ceramic sheet having few undulations or warps.

It is another object of the present invention to provide a method for the production of an elongated ceramic sheet in which the length of the sheet is not limited by the size of the sintering furnace.

It is another object of the present invention to provide a method for production of an elongated superconducting sheet which is of high elasticity and flexibility.

According to one aspect of the present invention, a method for the production of a ceramic sheet includes the following steps:

First, a pair of green sheets are prepared from ceramic material by the doctor-blade method. Each of the green sheets has first and second surfaces. The prepared sheets are placed one over the other and adhered to each other in such a manner that either the first surfaces of the sheets oppose each other or the second surfaces of the sheets oppose each other; a united two-ply green sheet is thereby obtained. A separating means is disposed on a surface of the two-ply green sheet. The two-ply green sheet is rolled, with the separating means, around a core. The united green sheet, with the separating means, is sintered in a rolled configuration, thereby producing a rolled ceramic sheet.

As mentioned above, the green sheet, prepared by the doctor-blade method, varies in composition through its thickness due to gravitational-setting effects during hardening. Consequently, the sides of the first and second surfaces are of different composition. However, by virtue of the adhering of like surfaces of a pair of green sheets, the united ceramic sheet is symmetric around the adhesive layer. Therefore, after the sintering step, the obtained ceramic sheet has few undulations or warps.

Furthermore, since the united green sheet with the separating means is rolled-up, the sintered ceramic sheet of an optional great length can be obtained without the use of a sintering furnace of special dimensions.

DETAILED DESCRIPTION OF THE PREFERRED EMBODIMENTS

Various preferred embodiments of the present invention will be described in detail hereinafter.

FIRST EMBODIMENT

A first embodiment of the present invention will be described with reference to FIGS. 1 through 5.

First, a pair of green sheets are prepared from ceramic starting material by the well-known doctor-blade method. That is, a ceramic powder is mixed with a fluid medium, a plasticizer, a binder, and a diffuser, in order to produce a slurry. As the ceramic material in the present invention, a material of high ductility and plasticity, such as PSZ (Partially Stabilized Zirconia), $Si_3N_4$, or Sialon, is preferably utilized. PSZ is $ZrO_2$ combined with a stabilizer (for example, $Y_2O_3$, MgO, CaO, and/or $CeO_2$).

Figure 1:
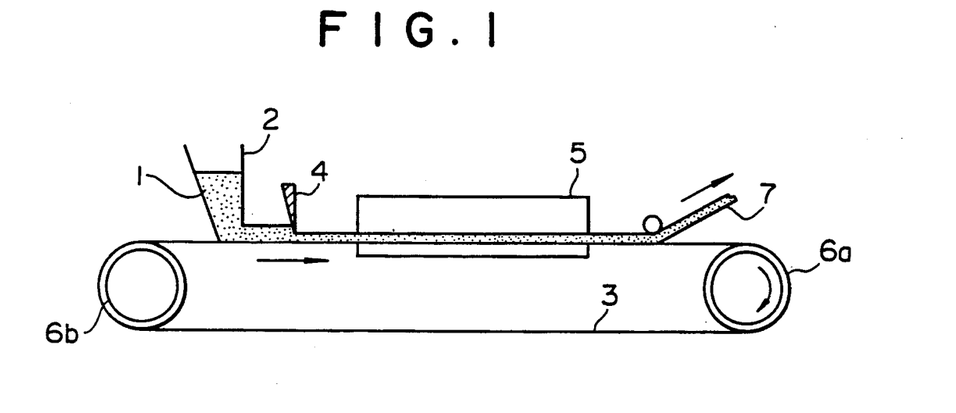
FIG. 1 is a simplified side view of an apparatus utilized in the doctor-blade method, for preparing green sheets which are to be used in a method for production of an elongated ceramic sheet according to the present invention.

The slurry or slip is poured into a doctor-blade apparatus shown in FIG. 1. The doctor-blade apparatus comprises a port 2, a carrier belt 3, a doctor-blade 4, and a dryer 5. The belt 3 loops around a pair of drums 6a and 6b. The upper path of the belt 3 is disposed horizontally. The wedge-shaped doctor-blade 4 is disposed above the belt 3 in such a manner that the tapered end thereof is opposed to the upper horizontal path of the belt 3 at a uniform thickness. The doctor-blade 4 has the same width as that of the belt 3 along a direction perpendicular to the travel of the paper in FIG. 1. The dryer 5, which provides a heated air-flow, is disposed along the path of the upper straight horizontal path. The slip 1 is supplied on the upper straight horizontal path of the belt 3 through the port 2. Then, the slip 1 is carried by the belt 3 toward the right in FIG. 1. Next, the thickness of the slip 1 is made uniform by passing through the space between the doctor-blade 4 and the belt 3. The slip 1 of uniform thickness is then introduced into the dryer 5 so as to be heated and dried. Accordingly, a rubber-textured green sheet 7 is obtained. The dried sheet 7 is separated from the belt 3 and then continuously rolled around a roller.

The green sheet 7 has first and second surfaces. The green sheet varies in composition through its thickness due to gravitational-setting effects during hardening. In other words, the first and second surfaces are of different composition.

The maximum width of the green sheet is determined by the width of the belt. However, the length of the green sheet is not limited by the dimensions of the doctor-blade apparatus. The thickness the green sheet should be determined by the intended usage of and demands placed on the ceramic with regard to mechanical strength. The thickness of the sheet is preferably 10 to 1,000 μm. More preferably, the thickness is 10 to 200 μm since the ceramic sheet is to be shaped into a coiled configuration.

A pair of green sheets 7 (7a and 7b) are prepared as mentioned above.

Figure 2:
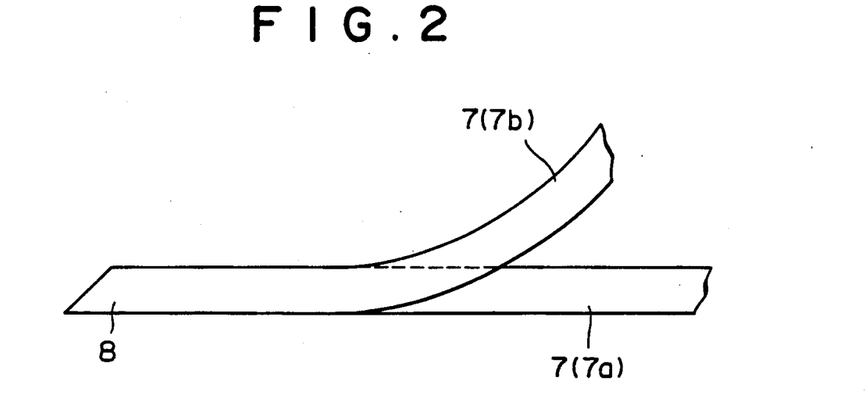
FIG. 2 is a perspective view showing that the green sheets made by the apparatus in FIG. 1 are arranged one on the other.
Figure 3:
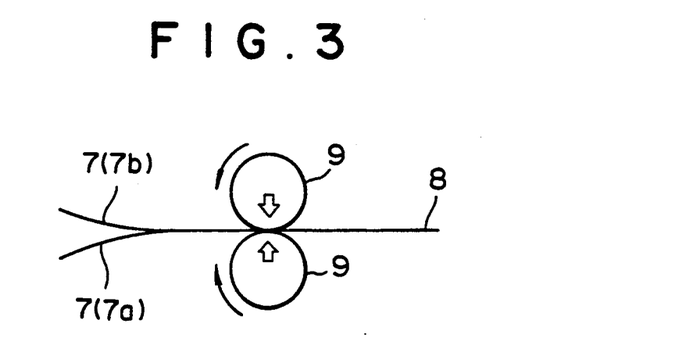
FIG. 3 is a simplified side view showing that the united green sheets in FIG. 2 are rolled so as to adhere tightly one to the other to form a united green sheet.

The prepared green sheets 7a and 7b are placed one on the other and adhered to each other in such a manner that the first surfaces of the sheets oppose each other as shown in FIGS. 2 and 3. Alternatively, the second surfaces of the sheets 7a and 7b oppose each other, so that a united two-ply green sheet 8 is obtained.

The adhesive for adhering the prepared green sheets 7a and 7b preferably includes a medium which is of the same group as the binder in the green sheets 7a and 7b in the first embodiment. For example, if the binder in the green sheets 7a and 7b is an organic binder such as polyvinyl-alcohol, an organic adhesive such as polyvinyl-alcohol, polyvinyl-pholmal, epoxy adhesive, acrylic adhesive, vinyl acetate, rubber adhesive, or chloropurene is preferably used.

In order to firmly adhere the green sheets 7a and 7b to each other, one green sheet is placed on the other green sheet, with the adhesive layer therebetween, and the two-ply green sheet is introduced between a pair of rotating rollers 9 as shown in FIG. 3.

Figure 4:
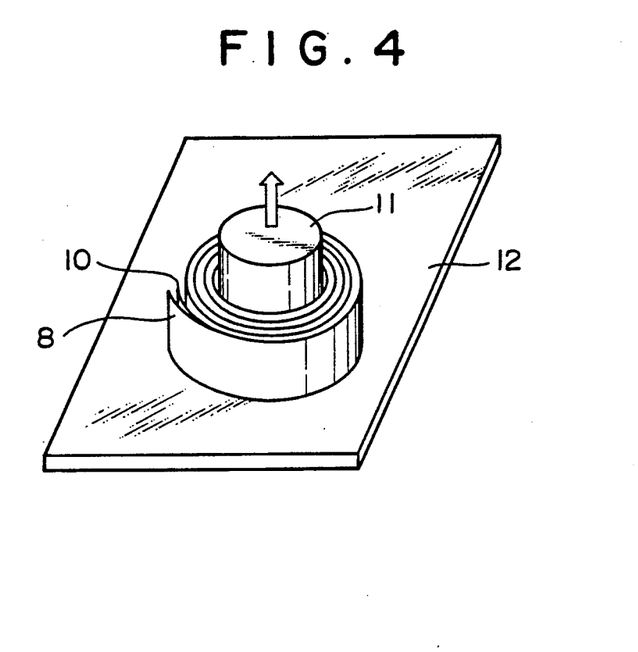
FIG. 4 is a perspective view of the two-ply green sheet in FIG. 3 with a separating means, when the united green sheet, with the separating means, is rolled around a core.

Next, a separating means 10 is disposed on one side of the united green sheet 8 as shown in FIG. 4. The separating means 10 is selected so that the separating means 10 does not react with nor adhere to the united green sheet 8 when the united green sheet 8 is sintered. If the ceramic material includes $ZrO_2$, a sheet mainly composed of a binder and powder of alumina or powder of boron is placed over the united green sheet 8 as the separating means 10. Alternatively, the powder can be directly dusted on one or both sides of the united green sheet 8.

The united green sheet 8 is rolled, with the separating means 10, around a core 11 which is generally cylindrical.

Then, the rolled united green sheet 8 is disposed on a setting plate 12 in such a manner that the central axis of the core 11 is perpendicular to the setting plate 12. Next, the core 11 is removed from the united green sheet 8 which was rolled around the core 11, so that the coil-shape of the united green sheet 8 is maintained.

The united green sheet 8, with the separating means 10, is sintered in the rolled configuration thereby producing a rolled ceramic sheet. The united green sheet 8 and the setting plate 12 on which the united green sheet is set are both moved into a sintering furnace. Then, the united green sheet 8 is sintered under standard sintering conditions which depend on the species of the ceramic material. For example, the sintering temperature for $ZrO_2$ is 1,300 to 1,600° C. The sintering time is from one-half to several hours.

Figure 5:
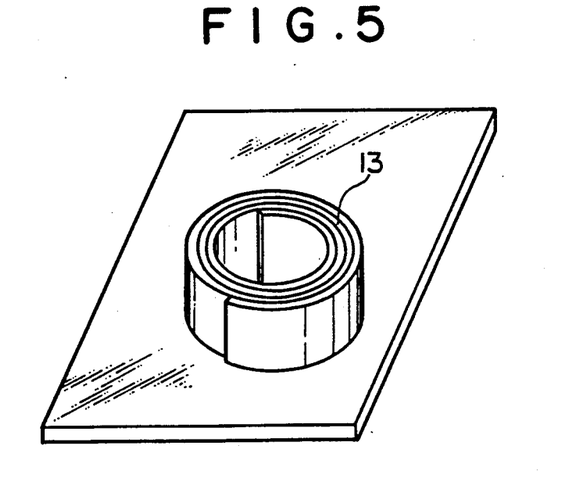
FIG. 5 is a perspective view of the united two-ply ceramic sheet after sintering.
Figure 6:
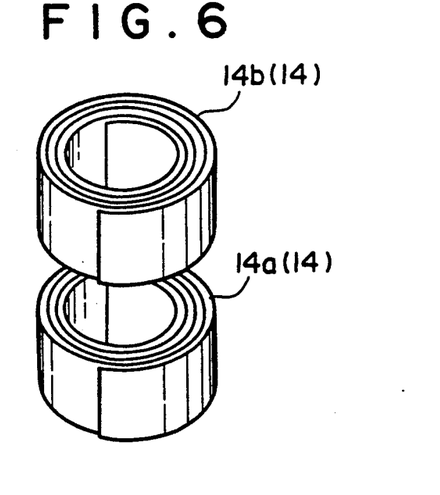
FIG. 6 is a perspective view of a pair of separated ceramic sheets taken from the united ceramic sheet in FIG. 5.

As a result, an elongated rolled sintered ceramic sheet 13 can be obtained as illustrated in FIG. 5. By virtue of the adhering of the like surfaces of a pair of green sheets, the united green sheet 8 has a composition which is symmetrical about the plane of adhesion of the green sheets. Forces which may cause undulation or warp are thereby counteracted. Therefore, after the sintering step, the obtained ceramic sheet 13 has few undulations or warps.

In addition, since the united green sheet 8, with the separating means 10, is rolled, the sintered ceramic sheet 13 may be very long, and these lengths can be obtained without using a sintering furnace of special dimensions.

The obtained ceramic sheet 13, in which the united condition is maintained, can be utilized as a substrate, on which an electric circuit, electrode, or the like is mounted.

If a planar ceramic sheet is desired as the final product, a core 11 of a very large diameter can be utilized. In this case, the obtained ceramic sheet originally is curved less than if the core were of a smaller diameter, and can be straightened and made planar by virtue of the flexibility of the ceramic material. Alternatively, the core may be of an elliptical or oval cross section, and may include some planar sections.

FIRST EXAMPLE

On the basis of the above explanation, a ceramic sheet was produced. The materials of the green sheet were as follows:

Material Powder: $ZrO_2$ containing $Y_2O_3$ at 3% by molecular ratio
Medium: MEK (methyl-ethyl-ketone)
Plasticizer: D-butyl-phthalate
Binder: polyvinyl-alcohol
Diffuser: triolein The materials were crushed and mixed with a ball mill for 72 hours so that a uniform slurry was obtained. The slurry was formed as a sheet by the doctor-blade method. Next, the fluid medium was evaporated by heating so that the sheet was hardened. The green sheet was then cut to a prescribed length. Each of the pair of obtained green sheets was 1 m long, 13.3 mm wide, and 100 μm thick.

Polyvinyl-alcohol was painted on the first surfaces of the green sheets as an adhesive. A separating sheet, mainly composed of boron powder, was placed on the united green sheet. The separating sheet was 1 m long, 13.3 mm wide, and 150 μm thick. A core of a circular cross section and a diameter of 10 cm was provided. The united green sheet was rolled around the core in such a manner that the separating sheet was radially inward of the united green sheet in each winding. Then, the united sheet was placed on the setting plate and the core was removed from the roll. The united sheet, with the separating sheet, was sintered at 1,500° C. for 1 hour.

Consequently, a rolled elongated sintered sheet made of $ZrO_2$ was produced.

SECOND EMBODIMENT

With reference to FIGS. 1 through 8, a second embodiment of the present invention will be described hereinafter.

The second embodiment is based on the first embodiment which was described with reference to FIGS. 1 through 5. After finishing the process in the first embodiment, the sintered ceramic sheet 13 is separated at the boundary of the green sheets 7a and 7b, i.e., at the above-mentioned adhesive. Thus, a pair of thin ceramic sheets 14a and 14b are obtained from the sintered ceramic sheet 13. In this step, first a very thin metallic tip or blade is thrust into the adhesive. Then, the ceramic sheets 14a and 14b are slowly separated from each other.

After finishing the process in the first embodiment, in other words, after finishing the sintering step, there is no possibility that the obtained ceramic sheet has any undulations or warps. Accordingly, the separated ceramic sheets 14a and 14b also have few undulations or warps.

In order to separate the sintered ceramic sheet 13 to yield two sheets 14a and 14b, the adhesive for adhering the prepared green sheets 7a and 7b must not include the fluid medium which is of the same group as the binder in the green sheets 7a and 7b. For example, if the binder in the green sheets 7a and 7b is an organic binder such as polyvinyl-alcohol, a water soluble adhesive such as an acrylic adhesive or a starch-based adhesive is employed. If the binder in the green sheets 7a and 7b is a water soluble binder, an organic adhesive such as polyvinyl-alcohol or chloropurene is used.

The functions of the adhesives mentioned above are described below with reference to FIGS. 7 and 8, which are enlarged side cross sections of the united green sheet 8.

Figure 7:
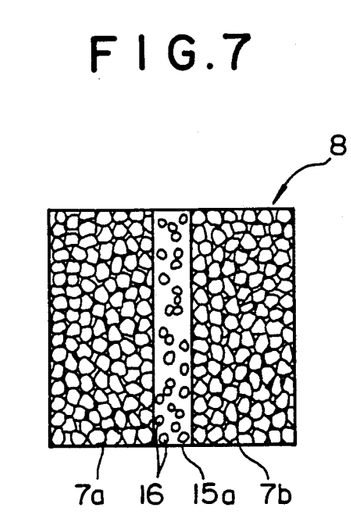
FIG. 7 is an enlarged side cross section of the united green sheet in FIG. 5 during sintering, when the prepared green sheets include particles of binder which will migrate into an adhesive used for adhering the green sheets to each other.

As shown in FIG. 7, if the adhesive 15a includes the medium which is the same as the binder in the prepared green sheets 7a and 7b, the binder, which binds ceramic particles 16 in the prepared sheets 7a and 7b, is suspended in a colloidal suspension by the medium of the adhesive 15a. The ceramic particles 16 diffuse into the layer of the adhesive 15a. The ceramic particles 16, diffused in the adhesive 15a, are so dense at such a high concentration that the adhesive 15a will harden sufficiently by means of sintering. Accordingly, after sintering the united green sheet 8, a relatively thick ceramic sheet 13 is obtained composed of a pair of green sheets 7a and 7b which are securely united. This situation is preferable in the first embodiment, however, it is not preferable in the second embodiment.

Figure 8:
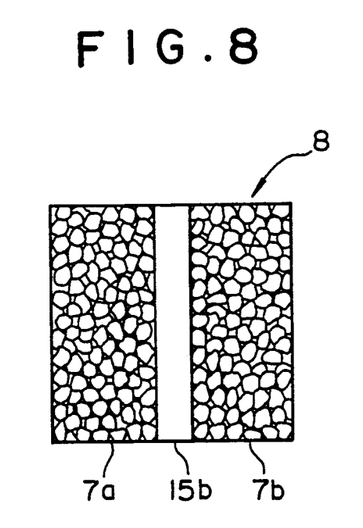
FIG. 8 is an enlarged side cross section of the united green sheet in FIG. 5 during sintering, when the prepared green sheets include binder particles which will not migrate into the adhesive used for adhering the green sheets to each other.

On the other hand, if the adhesive 15b includes a medium which differs from the binder, as shown in FIG. 8, the binder is not suspended in a colloidal suspension and the diffusion of the material particles 16 is restricted. Consequently, the pair of prepared green sheets 7a and 7b do not bind to each other even if the united green sheet 8 is sintered. The green sheets 7a and 7b having such a adhesive layer disposed therebetween are sintered independently from each other while being held together by the adhesive 15b. Hence, the pair of ceramic sheets 14a and 14b are easily separated from the adhesive 15b.

In the second embodiment, by virtue of the adhering of like surfaces of the pair of green sheets, the united green sheet 8 has a symmetrical constitution around the boundary of the prepared green sheet. The forces which may cause undulations or warps are, by virtue of the symmetrical arrangement, compensated for. Therefore, after the sintering step, the obtained ceramic sheet 13 has few undulations or warps. After finishing the sintering step, there is a low probability that the obtained ceramic sheet has undulations or warps. Accordingly, the separated ceramic sheets 14a and 14b also have few undulations or warps.

In the conventional doctor-blade methods, undulations or warps occur during the initial stage of the sintering. However, in the second embodiment, the undulations or warps are eliminated by the adhesive and the symmetrical arrangement maintained thereby, at the initial stage of the sintering. Accordingly, after the initial stage, the green sheets 7a and 7b in the united green sheet 8 are firmly adhered to each other even though an adhesive which includes media other than the binder in the green sheets 7a and 7b was used.

In addition, since the united green sheet 8, with the separating means 10, is rolled, a sintered ceramic sheet 13 of a great length can be obtained without the use of a sintering furnace of spacial dimensions.

The thinner the prepared green sheet is, the more difficult the processing of the prepared green sheet.

However, since the green sheets are placed one on the other and adhere to each other, the thickness is doubled and so processing is facilitated. For example, when the rolled united green sheet 8 is stood upright on the setting plate 12 for sintering, the united green sheet 8 is stable. As a result, even thin ceramic sheets 14 of a thickness less than 50 μm can be easily produced.

If a planar ceramic sheet is necessary, the core 11 with a very large diameter can be utilized. In this case, the separated ceramic sheet is only slightly curved and, furthermore, the ceramic sheet can be planar by virtue of the flexibility of the ceramic material. Alternatively, the core may have a generally elliptical or oval cross section, including some planar portions.

The obtained rolled ceramic sheet 13, in which the united condition is maintained, can be utilized as a substrate on which an electric circuit, electrode, or the like, is mounted.

SECOND EXAMPLE

On the basis of the above explanation, a ceramic sheet was produced. The materials of the green sheet were as follows:

Material Powder: $ZrO_2$ containing $Y_2O_3$ at 3% by molecular ratio
Medium: MEK (methyl-ethyl-ketone)
Plasticizer: D-butyl-phthalate
Binder: polyvinyl-alcohol
Diffuser: triolein The materials were crushed and mixed with a ball mill for several tens of hours so that a uniform slurry was obtained. The slurry was formed into a sheet by the doctor-blade method. Next, the fluid medium was evaporated by heating then so that the sheet was hardened. The green sheet was then cut to a prescribed length. Each of the pair of obtained green sheets was 1 m long, 10 mm wide, and 50 μm thick.

Acrylic adhesive was painted on the first surfaces of the green sheets as an adhesive. A separating sheet, mainly composed of alumina powder was placed on the united green sheet. The separating sheet was 1 m long, 10 mm wide, and 150 μm thick. A core of a circular cross section and a diameter of 10 cm was provided. The united green sheet was rolled around the core in such a manner that the separating sheet was radially inward of the united green sheet in each winding. Then, the united sheet was placed on the setting plate and the core was removed from the roll. The united sheet, with the separating sheet, was sintered at 1,500° C. for 1 hour.

Consequently, a rolled elongated sintered sheet made of $ZrO_2$ was produced. Then, a thin metallic plate is wedged into the layer of the adhesive so that the sintered ceramic sheets were separated to produce a pair of rolled elongated ceramic sheets.

The ceramic sheets obtained by the separation were very thin, of a uniform thickness, had a superior elasticity, and few undulations or warps. The ceramic sheets obtained by many repetitions of the above-described experiments had thicknesses of from 40 to 50 μm.

THIRD EMBODIMENT

A third embodiment of the present invention will be described hereinafter with reference to FIGS. 1 through 5, and FIGS. 9 through 11. The third embodiment is based on the first embodiment, which is described above with reference to FIGS. 1 through 5, and intended to produce an elongated superconducting sheet.

First, a rolled sintered ceramic sheet 13 in FIG. 5 is produced in the same manner as in the first embodiment. The ceramic material is preferably PSZ (Partially Stabilized Zirconia) or Stabilized Zirconia. The ceramic sheet 13 will be hereinafter used as a substrate for producing the rolled sheet of a superconductor.

Figure 9:
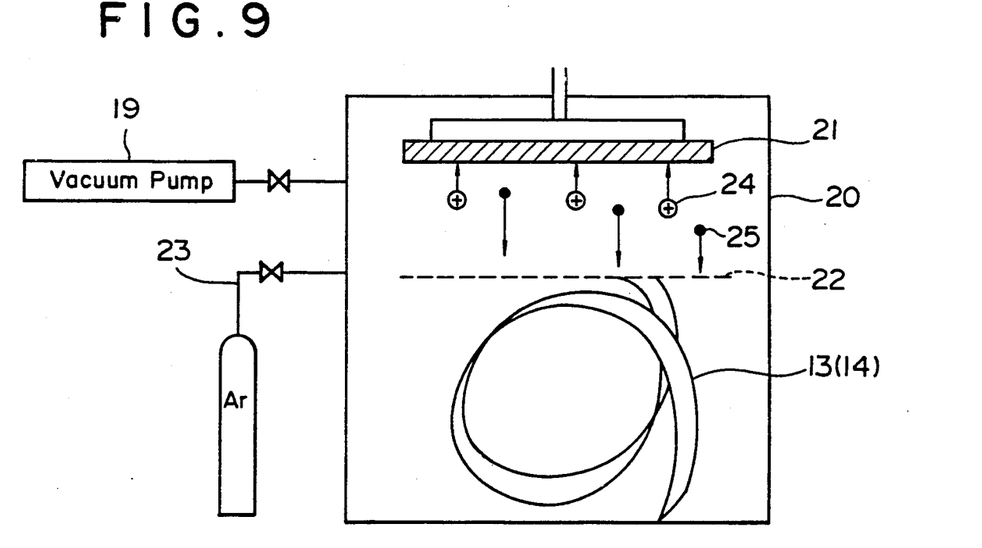
FIG. 9 is a schematic view of a sputtering apparatus for forming a superconducting layer on the sintered ceramic sheet shown in FIGS. 5 or 6.

Next, the ceramic sheet 13 is introduced into a sputtering apparatus illustrated in FIG. 9. Then, while a side of the ceramic sheet 13 is partially exposed, a thin film of oxide superconductor is formed on a side of the ceramic sheet 13.

The sputtering apparatus comprises a vacuum chamber 20, a vacuum pump 19 for realizing the vacuum in the vacuum chamber 20, and an argon supply 23 for supplying argon gas into the vacuum chamber 20. The vacuum chamber 20 includes a cathode 21 disposed within the vacuum chamber 20, and a shutter 22 which is openable for opening and shutting the sputtering ray from the cathode 21. The cathode is preferably made of a high-temperature superconductor, for example, the Y-Ba-Cu-0 group superconductor, the Bi-Sr-Ca-Cu-O group superconductor, or the Tl-Ba-Ca-Cu-O group superconductor.

The ceramic sheet 13 is placed in the vacuum chamber in such a manner that the shutter 22 is interposed between the ceramic sheet 13 and the cathode 21 when the shutter is closed. The vacuum chamber 20 is evacuated by the vacuum pump 19 and then filled with argon gas at a low pressure by the argon supply 23. Then, a voltage from 300 to 2,000 volts is impressed to the cathode 21 and the ceramic sheet 13 in order to sputter on the ceramic sheet 13 in an argon atmosphere. In FIG. 9, numeral 24 schematically denotes argon ions and numeral 25 denotes sputtered atoms.

In the sputtering process, the ceramic sheet 13 is heated to several hundred degrees centigrade in order that the sputtering atoms be distributed uniformly on the sides of the ceramic sheet 13. The ceramic sheet 13 is slowly rotated about the rolling center axis thereof while the ceramic sheet is pulled along the axial direction so that a side of each winding is exposed in order that the superconductive thin film is formed on the side of the ceramic sheet 13. The rate of formation of the thin film is several tens of Å/s.

Figure 10:
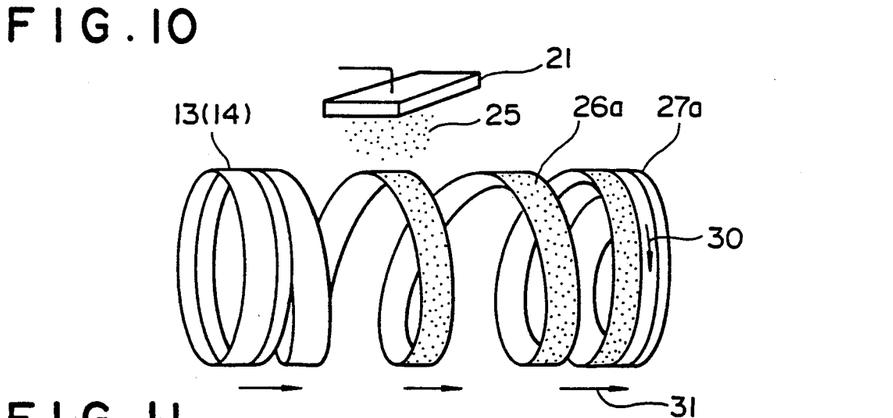
FIG. 10 shows a sputtering step performed in the apparatus in FIG. 9, for forming the superconducting layer on the sintered ceramic sheet.

FIG. 10 depicts the sputtering process as described above. In the figure, the cathode 21 is disposed radially outside and in the transverse direction of the roll of the ceramic sheet 13. The ceramic sheet 13 is rotated, as indicated by arrow 30, about the axis of the roll thereof. As the ceramic sheet 13 is unrolled from one roll, it advances gradually, as indicated by arrow 31, and is taken up by another roll. During the step, a superconductive film 26a of the oxide superconductor is formed on the radially outer side of the ceramic sheet 13. Accordingly, an elongated superconducting sheet 27a can be produced.

Figure 11:
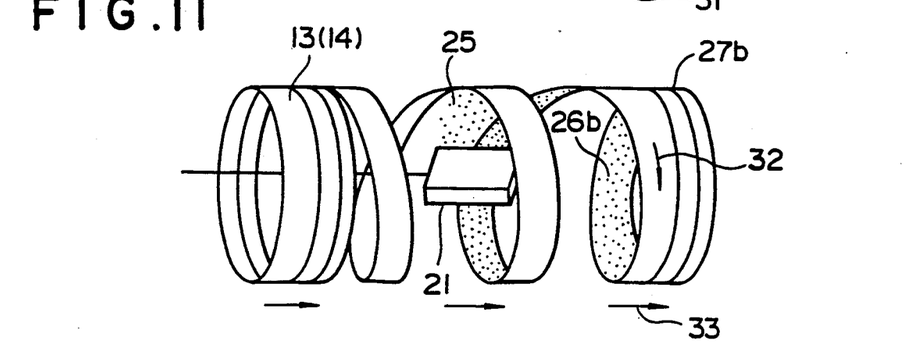
FIG. 11 shows a modification of the sputtering step in FIG. 10.

FIG. 11 depicts a variation of the sputtering process. In the figure, the cathode 21 is disposed radially inward and in the transverse direction of the rolled ceramic sheet 13. The ceramic sheet 13 is rotated, as indicated by arrow 32, about the axis of the coil thereof. As the ceramic sheet 13 is unrolled from one roll, it advances gradually, as indicated by arrow 33, and is rolled up by another roll. During this step, a superconducting film 26b of the oxide superconductor is formed on the radially interior side of the ceramic sheet 13. Accordingly, a superconducting sheet 27b can be produced. This variation is advantageous in view of the mechanical strength of the superconductive sheet in comparison with the example in FIG. 10.

It is possible that the sputtering processes shown in FIGS. 10 and 11 are combined so that the superconductive films 26a and 26b are formed on both the radially outer and inner sides of the ceramic sheet 13.

In the method of production of the superconducting sheet, since the superconductive film is formed on the side or sides of the coiled ceramic sheet by sputtering, the superconducting film is uniform and of high quality with minimal chipping and cracking.

In addition, since the coiled ceramic sheet 13, which is of high elasticity and flexibility, is used as the substrate, the superconducting sheet is also high elasticity and flexibility, so that it is easy to manufacture the superconducting sheet into the roll.

Such a superconducting rolled ribbon may be preferably used in many superconductor apparatuses or devices, for example, magnets for nuclear magnetic resonance apparatuses, particle accelerators, superconductor magnetically levitated trains (linear motor cars), or superconductor magnetically driven ships.

THIRD EXAMPLE

On the basis of the third embodiment, a superconductive sheet was produced from a ceramic sheet.

The materials of the green sheet were as follows:
Material Powder: $ZrO_2$ containing $Y_2O_3$ at 3% molecular ratio
Medium: MEK (methyl-ethyl-ketone)
Plasticizer: D-butyl-phthalate
Binder: polyvinyl-alcohol
Diffuser: triolein The materials were crushed and mixed with a ball mill for about 72 hours so that a uniform slurry was obtained. The slurry was formed as a sheet by the doctor-blade method. Next, the fluid medium was evaporated by heating so that the sheet was hardened. The green sheet was then cut to prescribed length. Each of the pair of obtained green sheets was 1 m long, 10 mm wide, and 100 μm thick.

Polyvinyl-alcohol was painted on the first surfaces of the green sheets as an adhesive. A separating sheet mainly composed of boron powder was overlapped on the united green sheet. The separating sheet was 1 m long, 10 mm wide, and 150 μm thick. A core of a circular cross section and a diameter of 10 cm was provided. The united green sheet was rolled around the core in such a manner that the separating sheet was radially inwards in each winding. Then, the united sheet was placed on the setting plate and the core was removed from the roll. The roll united sheet, with the separating sheet, was sintered at 1,500° C. for 1 hour.

Consequently, a coiled elongated ribbon of sintered $ZrO_2$ was produced.

Then, the coiled ceramic sheet was placed into the sputtering apparatus shown in FIG. 9. The cathode made of a Y-Ba-Cu-O group superconductor was disposed radially outside of the coiled sheet. Then, the Y-Ba-Cu-O group superconductor was sputtered on the radially outer side of the ceramic sheet under the following conditions:
Impressed Voltage: 800 V
Pressure of Argon Gas: 10 Pa
Temperature: 350° C.
Rate of formation of Film: 50 Å/sec The obtained superconductive film of the superconducting ribbon attained a thickness of 10 μm. The film becomes a superconducting in liquid nitrogen at a temperature of 77 K.

FOURTH EMBODIMENT

A fourth embodiment of the present invention will be described hereinafter with reference to FIGS. 1 through 11. The fourth embodiment is based on the second embodiment, which is described above with reference to FIGS. 1 through 8, and is intended to produce an elongated superconducting sheet.

First, a pair of coiled sintered ceramic sheets 14a and 14b are produced in the same manner as in the second embodiment. The ceramic material is also preferably PSZ or Stabilized Zirconia. The ceramic sheets 14a and 14b will be hereinafter used as a substrate for producing the coiled superconductor.

Next, one of the ceramic sheets 14 is introduced into the sputtering apparatus shown in FIG. 9. Then the sputtering process described as the third embodiment is applied to the ceramic sheets. Consequently, a superconducting film is formed on the radial exterior and/or interior of the ceramic sheet 14, so that the coiled superconducting sheet is produced in a manner similar to that in the third embodiment.

In the production method of the fourth embodiment, since the ceramic sheet 14, which will form the substrate of the superconducting sheet, is produced by separating the ceramic sheet 14 from the sintered ceramic sheet 13, the produced coiled superconducting sheet is very thin.

While the various producing methods for the superconducting sheets are described above, it is to be understood that the invention is not to be limited to the disclosed embodiments, but on the contrary, is intended to encompass various modifications.

In the above description, the sputtering is utilized for forming the superconductive film on the coil-shaped ceramic sheet. However, various thin-film-forming process, such as chemical vapor deposition or other deposition, can be utilized instead.

FOURTH EXAMPLE

On the basis of the fourth embodiment, an elongated superconducting sheet was produced after a pair of ceramic sheets were produced.

First, a pair of ceramic sheets were produced in the same manner as in the second example. Each of the produced ceramic sheets was 1 m long, 10 mm wide, and 50 μm thick.

One of the ceramic sheets was placed into the sputtering apparatus shown in FIG. 9. Then, the same sputtering process as described in the third example was applied to the ceramic sheet.

The obtained superconducting film of the coiled superconducting sheet attained a thickness of 10 μm. The substrate, ceramic sheet, was very thin at 50 μm. The superconducting film becomes superconducting in liquid nitrogen at a temperature of 77 K.

What is claimed is:
1. A method of producing a ceramic sheet, comprising the steps of:
   (a) preparing a pair of green sheets from ceramic starting material by the doctor-blade method, each of the green sheets having first and second surfaces, each of the green sheets including a binder;

(b) placing one of the prepared green sheets on the other and adhering the green sheets in such a manner that either the first surfaces of the green sheets oppose each other or the second surfaces of the green sheets oppose each other, and adhering the green sheets by means of an adhesive which is immiscible with the binder in the green sheets so that an adhered green sheet is obtained;

(c) disposing a separating means on one side of the adhered green sheet;

(d) rolling the adhered green sheet with the separating means around a core means; and (e) sintering the adhered green sheet with the separating means in a rolled configuration, thereby producing a rolled ceramic sheet; and (f) separating the sintered ceramic sheet at the boundary of the green sheets, thereby obtaining a pair of ceramic sheets from the sintered ceramic sheet.

2. A method according to claim 1, wherein the binder in the green sheets is an organic binder and the adhesive used for adhering the green sheets is a water soluble adhesive.

3. A method according to claim 1, wherein the binder in the green sheets is a water soluble binder and the adhesive used for adhering the green sheets is an organic adhesive.

4. A method of producing an elongated superconducting sheet, comprising the steps of:

(a) preparing a pair of green sheets from ceramic starting material by the doctor-blade method, each of the green sheets having first and second surfaces, each of the green sheets including a binder;

(b) placing one of the prepared green sheets on the other and adhering the green sheets in such a manner that either the first surfaces of the green sheets oppose each other or the second surfaces of the green sheets oppose each other, and adhering the green sheets by means of an adhesive which is immiscible with the binder in the green sheets so that an adhered green sheet is obtained;

(c) disposing a separating means on one side of the united green sheet;

(d) rolling the adhered green sheet with the separating means around a core means; and (e) sintering the adhered green sheet with the separating means in a rolled configuration, thereby producing a ceramic sheet;

(f) separating the sintered ceramic sheet at the boundary of the green sheets, thereby obtaining a pair of ceramic sheets from the sintered ceramic sheet; and (g) forming a superconducting layer on at least one side of the sintered ceramic sheet, thereby producing a rolled superconducting sheet.

5. A method according to claim 4, wherein the binder in the green sheets is an organic binder and the adhesive used for adhering the green sheets is water soluble adhesive.

6. A method according to claim 4, wherein the binder in the green sheets is a water soluble binder and the adhesive used for adhering the green sheets is an organic adhesive.

* * * * *